United States Patent
Bae

Patent No.: US 6,259,930 B1
Date of Patent: Jul. 10, 2001

(54) PORTABLE TELEPHONE ANTENNA CIRCUIT WITH REDUCED SUSCEPTIBILITY TO HUMAN BODY AND METHOD FOR REALIZING THE SAME

(75) Inventor: Seung-Gyun Bae, Kumi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/220,403

(22) Filed: Dec. 24, 1998

(30) Foreign Application Priority Data

Dec. 26, 1997 (KR) .................................................. 97-74171

(51) Int. Cl.$^7$ ....................................................... H04B 1/48
(52) U.S. Cl. .......................... 455/550; 455/269; 455/575
(58) Field of Search .................................. 455/550, 269, 455/275, 25, 575

(56) References Cited

U.S. PATENT DOCUMENTS

| | | | |
|---|---|---|---|
| 4,730,195 | * | 3/1988 | Phillips et al. ........................ 343/792 |
| 4,806,944 | * | 2/1989 | Jacomb-Hood ....................... 343/745 |
| 4,992,752 | * | 2/1991 | Cioffi ...................................... 330/54 |
| 5,668,560 | * | 9/1997 | Evans et al. ........................... 343/702 |
| 5,778,308 | * | 7/1998 | Sroka et al. ........................... 455/115 |
| 5,784,687 | * | 7/1998 | Itoh et al. ............................... 455/78 |
| 5,936,583 | * | 8/1999 | Sekine et al. ......................... 343/702 |

* cited by examiner

Primary Examiner—Daniel Hunter
Assistant Examiner—Thuan T. Nguyen
(74) Attorney, Agent, or Firm—Dilworth & Barrese, LLP (57) ABSTRACT

An antenna circuit for a portable telephone is provided. The antenna circuit prevents an increase in the standing wave ratio (SWR) when the portable telephone antenna comes in contact with the human body. The antenna circuit includes: an RF (Radio Frequency) module having an impedance of about 50Ω. An antenna having an impedance of about 450 to 500Ω radiates an RF signal output from the RF module into the air and outputs an RF signal captured from the air to the RF module. A matching circuit connected between the RF module and the antenna matches an impedance characteristic of the RF module with an impedance characteristic of the antenna. The matching circuit includes an inductor having an inductance of about 24 mH connected between an output of the RF module and the antenna and a capacitor having a capacitance of about 1 pF connected between the antenna and a ground, the capacitor being coupled in parallel to the inductor.

8 Claims, 7 Drawing Sheets

PORTABLE TELEPHONE ANTENNA CIRCUIT WITH REDUCED SUSCEPTIBILITY TO HUMAN BODY AND METHOD FOR REALIZING THE SAME

BACKGROUND OF THE INVENTION

1. Field of the Invention

The present invention relates to antennas for portable telephones and, in particular, to a portable telephone antenna circuit having reduced susceptibility to the human body and a method for realizing the same.

2. Description of the Related Art

A portable telephone, such as a cellular telephone or a cordless telephone, generally employs a helical antenna, a $\lambda/4$ antenna, a $\lambda/2$ dipole antenna or a $\lambda/2$ monopole antenna. However, the helical antenna is rarely employed in a portable telephone, since it has poor antenna characteristics. For example, a significant amount of power is converted to heat due to the high inductance of the helical antenna.

Figure 1A:
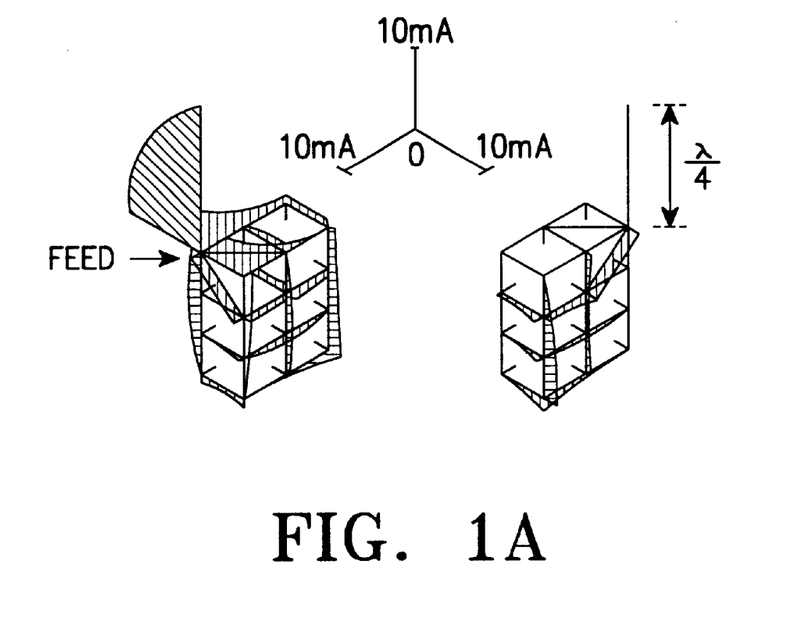
FIGS. 1A to 1C are diagrams illustrating current leakage caused when the various antennas applicable to a portable telephone come into contact with the human body.
Figure 1B:
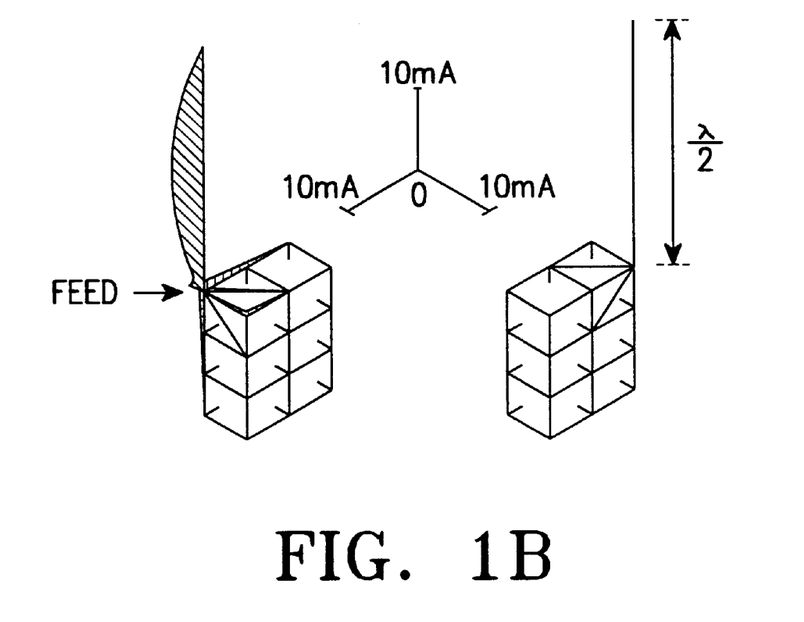
Figure 1C:
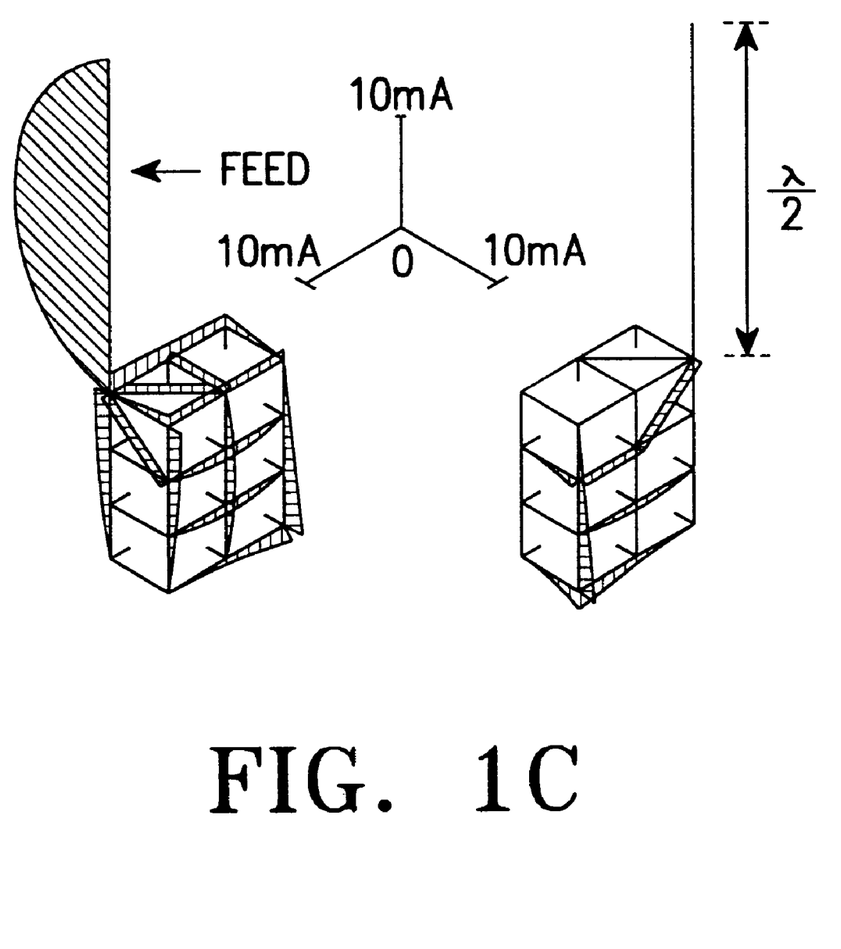

Moreover, the $\lambda/4$ antenna, the $\lambda/2$ dipole antenna and the $\lambda/2$ monopole antenna, which are commonly employed in a portable telephone, are susceptible to current leakage through the human body, as shown in FIGS. 1A to 1C. FIGS. 1A to 1C are diagrams illustrating current leakage caused when the various antennas applicable to a portable telephone come into contact with the human body. The leakage current flows through the user's body, when the user holds the portable telephone to his/her ear to converse using the telephone. An increase in the leakage current brings about a reduction in the coverage area of the portable telephone. Referring to FIGS. 1A to 1C, the $\lambda/4$ antenna (see FIG. 1A) has the largest current leakage, the $\lambda/2$ dipole antenna (see FIG. 1C) has the second largest current leakage, and the $\lambda/2$ monopole antenna (see FIG. 1B) has the least largest current leakage. That is, among the antennas of FIGS. 1A to 1C, the $\lambda/2$ monopole antenna can offer the widest coverage area to the portable telephone. For this reason, the $\lambda/2$ monopole antenna is widely employed in portable telephones.

Nevertheless, when the portable telephone employing the $\lambda/2$ monopole antenna comes into close contact with the human body, the standing wave ratio (SWR) increases, thus deteriorating the antenna characteristics. The increase in the SWR results in a reduction in the coverage area of the portable telephone.

Of course, the antenna for a portable telephone can be designed in fill consideration of such antenna characteristics. In such a case, however, the antenna is relatively longer in length than the body of the portable telephone. For example, in the case when the $\lambda/2$ monopole antenna is employed in a 900 Mhz cordless telephone, the antenna should be about 16 cm, which is much longer than the body of an ordinary cordless telephone.

SUMMARY OF THE INVENTION

It is therefore an object of the present invention to provide a portable telephone antenna circuit with reduced susceptibility to the human body and a method for realizing the same.

It is another object of the present invention to provide a portable telephone antenna circuit for preventing an increase in a standing wave ratio when the portable telephone antenna comes in contact with the human body, and a method for realizing the same.

It is still another object of the present invention to provide an antenna circuit for increasing a coverage area of a portable telephone and a method for realizing the same.

It is further still another object of the present invention to provide an antenna circuit capable of contributing to a reduction in length of an antenna for a portable telephone, and a method for realizing the same.

In one aspect of the invention, there is provided an antenna circuit for a portable telephone. The antenna circuit includes: an RF (Radio Frequency) module having an impedance of about 50Ω; an antenna having an impedance of about 450 to 500Ω, for radiating an RF signal output from said RF module into the air and outputting an RF signal captured from the air to said RF module; and a matching circuit connected between said RF module and said antenna to match an impedance characteristic of said RF module with an impedance characteristic of said antenna, wherein said matching circuit includes an inductor having an inductance of about 24 mH connected between an output of said RF module and said antenna and a capacitor having a capacitance of about 1 pF connected between said antenna and a ground, said capacitor being coupled in parallel to said inductor.

In another aspect of the invention, there is provided a method for embodying an antenna circuit for a portable telephone including an RF module having a first impedance, an antenna having a second impedance and a matching circuit connected between the RF module and the antenna to match the first impedance with the second impedance. In the method, the Smith chart is searched for real resistance component values of the antenna and the RF module, so as to designate the real resistance component value of the antenna as a value of a first position and the real resistance component value of the RF module as a value of a second position. A parallel capacitance value and a serial inductance value for moving the first position to the second position are calculated by using an admittance chart and an impedance chart of the Smith chart, respectively. The inductor having the calculated inductance value is connected between an output of the RF module and the antenna, and the capacitor having the calculated capacitance value is connected between the antenna and a ground, the capacitor being coupled in parallel with the inductor. The first impedance is about 50Ω and the second impedance is about 450 to 500Ω. The inductor has an inductance of about 24 mH and the capacitor has a capacitance of about 1 pF. The antenna is a $\lambda/2$ monopole antenna which is about 11 cm long.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

A preferred embodiment of the present invention will be described in detail hereinbelow with reference to the accompanying drawings. In the following description, numerous specific details are set forth to provide a more thorough understanding of the present invention. However, it will be apparent to one skilled in the art that the present invention may be practiced without these specific details. In other instances, well known functions or constructions have not been described so as not to obscure the present invention.

Figure 2:
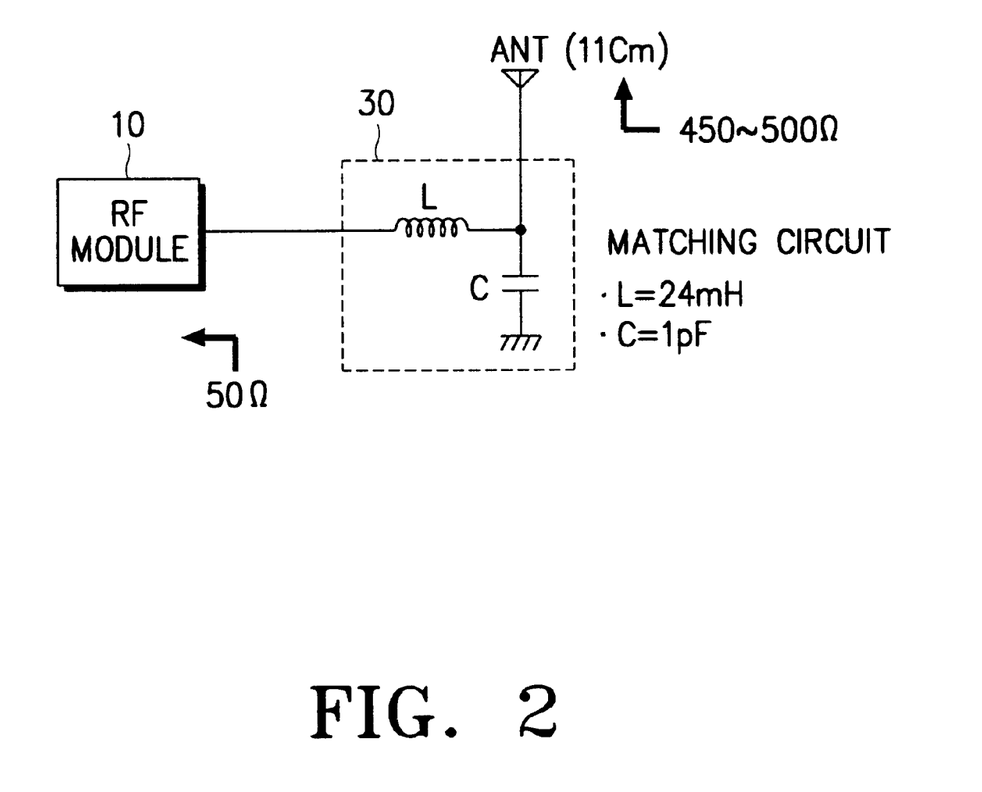
FIG. 2 is a diagram of an antenna circuit according to an embodiment of the present invention.

FIG. 2 is a diagram of an antenna circuit according to an embodiment of the present invention for a portable telephone employing a $\lambda/2$ monopole antenna. Conventionally, the $\lambda/2$ monopole antenna is about 16.7 cm long. Referring to FIG. 2, the antenna circuit includes a matching circuit 30 connected between an RF (Radio Frequency) module 10 of the portable telephone and an antenna ANT. The matching circuit 30 consists of an inductor L connected between RF module 10 and antenna ANT and a capacitor C connected between antenna ANT and a ground. The capacitor C is coupled in parallel with inductor L. The RF module 10 typically has an impedance of 50Ω whereas antenna ANT, which is reduced in length, has an impedance different from that of RF module 10. Thus, matching circuit 30 is employed to match the impedance of antenna ANT with the impedance of RF module 10.

When the portable telephone employing the antenna circuit of FIG. 2 comes in contact with the human body, the leakage current flows through the human body, thus deteriorating the antenna characteristics. According to an analysis of the $\lambda/2$ monopole antenna having an impedance characteristic ($Z = R \mp jX$), the $\lambda/2$ monopole antenna has a low real resistance R of about 200–300Ω and a reactance X of about –300 to –400Ω. When the antenna having such an impedance characteristic comes in contact with the human body the impedance of antenna ANT is mismatched with the impedance of RF module 10, resulting in an increase in the standing wave ratio (SWR) and a reduction in antenna efficiency. Therefore, in order to increase the antenna impedance and reduce the susceptibility of the antenna to the human body, the reactance component of the antenna impedance should be zero and the resistance component of the antenna impedance should be increased as high as possible.

As stated above, the antenna circuit according to an embodiment of the present invention includes RF module 10, antenna ANT, and matching circuit 30. The RF module 10 converts an IF (Intermediate Frequency) signal to an RF signal to output the RF signal to antenna ANT in a transmission mode, and converts the RF signal received from antenna ANT to an IF signal in a reception mode. The antenna ANT radiates the RF signal output from RF module 10 into the air, and provides the RF signal captured from the air to RF module 10. Here, RF module 10 and antenna ANT have impedance characteristics which are different from each other. That is, RF module 10 has an impedance of about 50Ω and antenna ANT has an impedance of about 450–500Ω. Therefore, matching circuit 30 is connected between RF module 10 and antenna ANT to match the impedance of antenna ANT with that of RF module 10. As stated above, matching circuit 30 consists of inductor L connected between an output of RF module 10 and antenna ANT and capacitor C connected between antenna ANT and ground, the capacitor C being coupled in parallel to inductor L.

Figure 4:
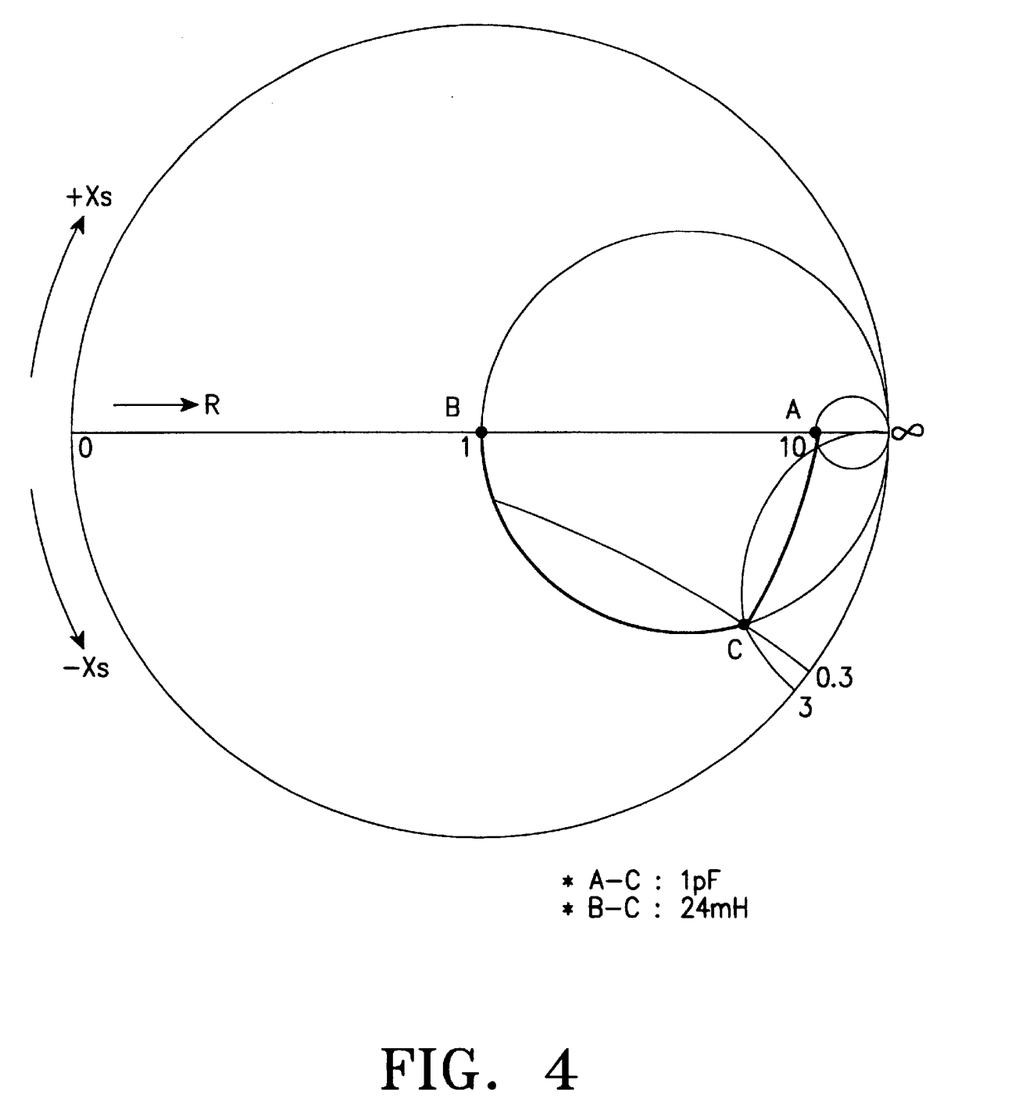
FIG. 4 is a Smith chart for calculating inductance and capacitance for a matching circuit shown in FIG. 2.

The antenna circuit of FIG. 2 can prevent deterioration of communication quality due to the low resistance component and the high reactance component of the $\lambda/2$ monopole antenna, even though the user holds the antenna of the portable telephone to his/her ear. Further, the antenna circuit according to the invention is suitable for a small-sized portable telephone. To this end, the antenna circuit of the invention should be designed to have zero reactance and a high resistance in order to secure a high impedance. FIG. 4 is a Smith chart for calculating the inductance and capacitance values to be used in the matching circuit 30 of FIG. 2. Thus, in order to obtain an antenna as described above, an antenna designer should couple the antenna circuit to a digital analyzer and search the Smith chart of FIG. 4 for the highest real resistance R of the antenna while reducing the length of the antenna ANT.

Figure 3:
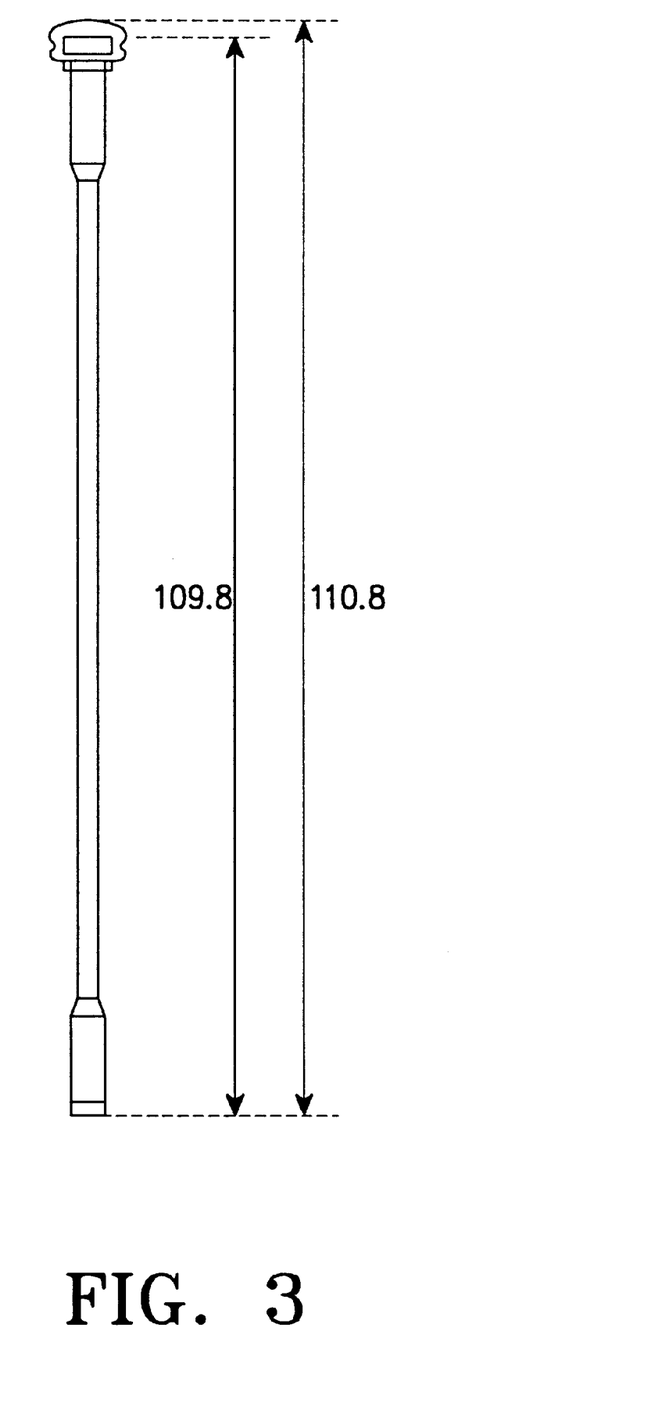
FIG. 3 is a diagram showing the structure of an antenna reduced in length according an embodiment of the present invention.

FIG. 3 is a diagram illustrating the structure of the antenna reduced in length according to an embodiment of the present invention. More specifically, the antenna is reduced in length to about 11 cm (110.8 mm maximum) as compared to a conventional antenna which has a length of about 16.7 cm. This antenna length is determined by searching the Smith chart for the highest real resistance R.

To realize the antenna circuit of the invention, the antenna designer should first search the Smith chart of FIG. 4 for the real resistance value of antenna ANT and the real resistance value of RF module 10. In FIG. 4, a position "A" is a position corresponding to the impedance of antenna ANT, where the reactance component is zero and there exists only a real resistance component. That is, the position "A" is the position where the 11 cm antenna ANT is least susceptible to the human body and has a real resistance of about 450 to 500Ω. A position "B" is a position corresponding to the impedance of RF module 10.

Next, the inductance value and the capacitance value of inductor L and capacitor C constituting matching circuit 30 should be determined in order to match RF module 10 and antenna ANT, which have different impedance characteristics. The inductance and capacitance values are determined by moving the position "A" to the position "B" on the Smith chart of FIG. 4 based on the matching principle. That is, in order to move the position "A" to the position "B", the position "A" should pass through the path (A→C) on the admittance chart and the path (C→B) on the impedance chart, wherein the path (A→C) on the admittance chart represents the parallel capacitance value and the path (C→B) on the capacitance of 1 pF and inductor L has an inductance of 24 mH.

As is well known in the art, the capacitance value and the inductance value of capacitor C and inductor L constituting matching circuit 30 are respectively determined by;

$$Z1 (= \alpha \times \text{characteristic impedance}) = 1/\omega C = 1/2\pi fC \ldots \quad (1)$$

$$Z2 (= \beta \times \text{characteristic impedance}) = \omega L = 2\pi fL \ldots \quad (2)$$

where $\alpha$ denotes the circumference angle of 0.3 where a position "C" meets the admittance chart, and $\beta$ denotes the circumference angle of 3 where the position "C" meets the impedance chart. Further, the characteristic impedances in Equations (1) and (2) denote the characteristic impedance of about 50Ω of RF module 10 of the portable telephone, and f denotes the operating frequency of the 900 MHz cordless telephone.

Figure 5:
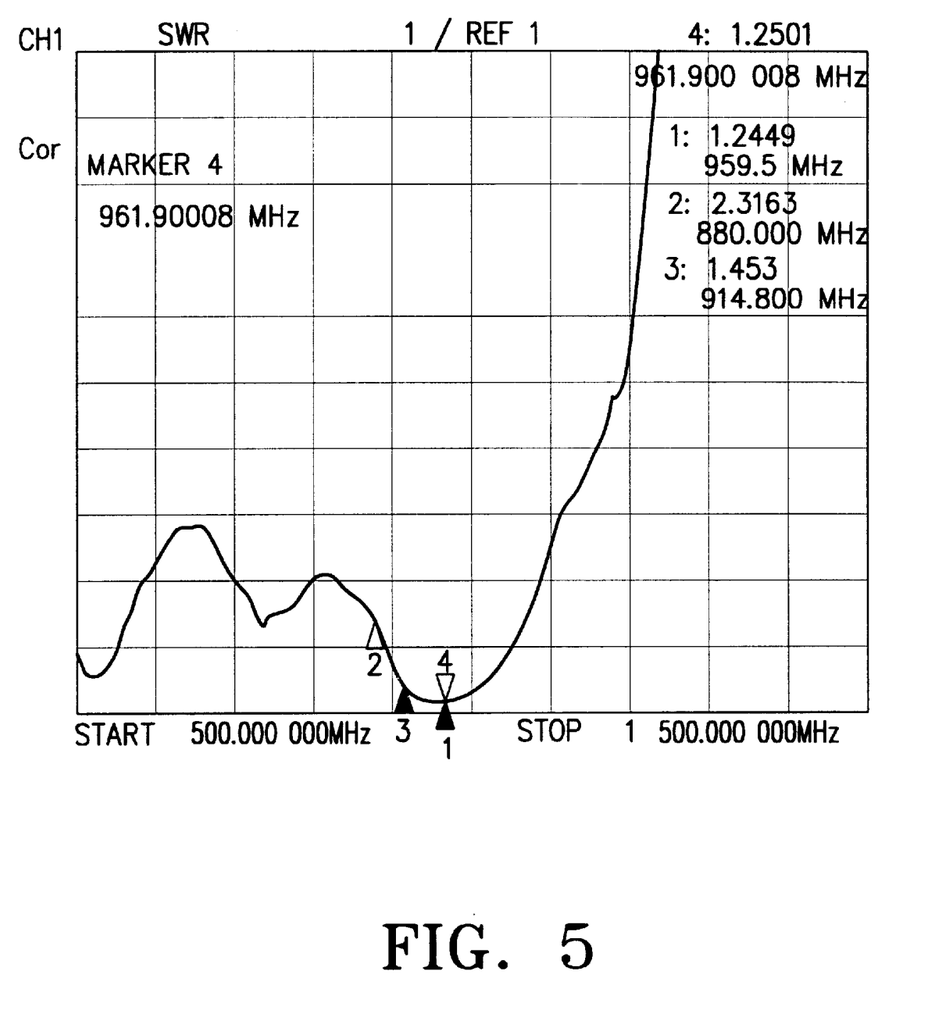
FIG. 5 is a standing wave ratio (SWR) chart measured when the portable telephone employing the antenna according to the present invention is separated from the human body.
Figure 6:
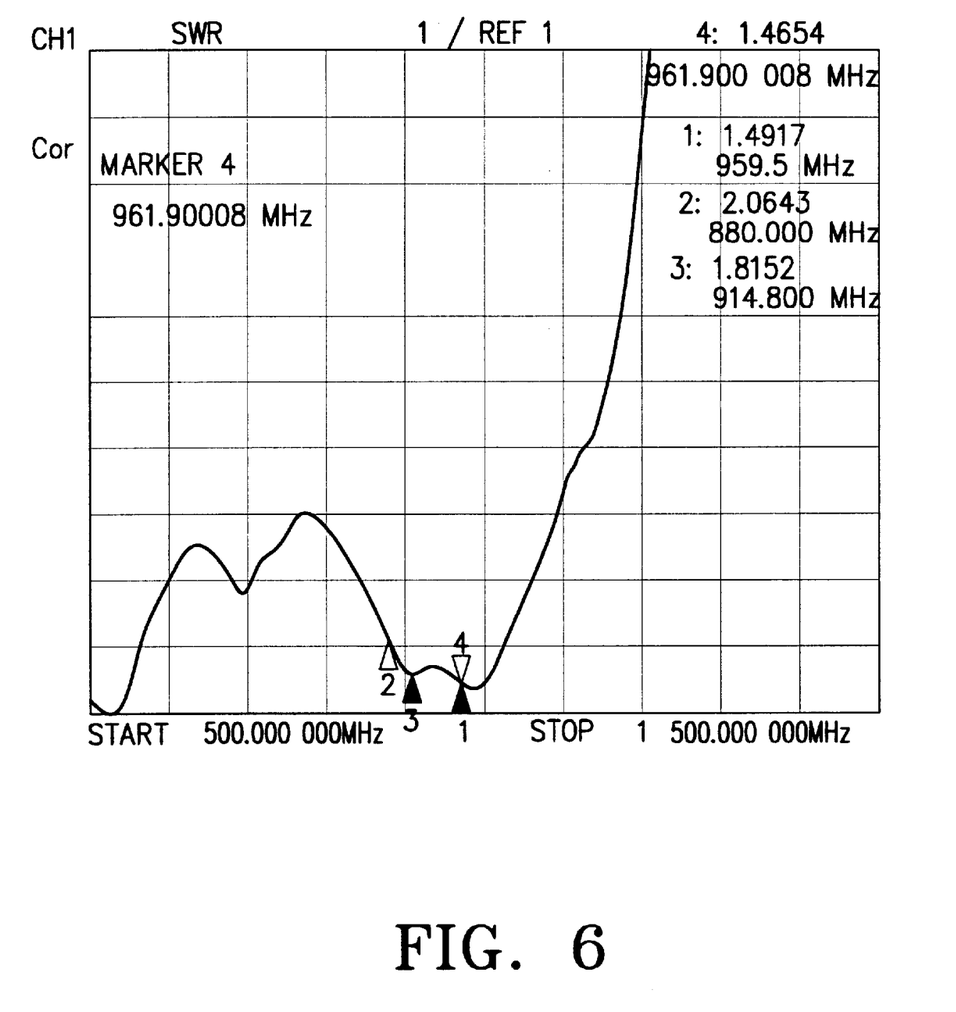
FIG. 6 is a standing wave ratio (SWR) chart measured when the portable telephone employing the antenna according to the present invention comes in contact with the human body.

FIG. 5 is a standing wave ratio chart which was measured when the portable telephone employing the antenna according to the present invention is separated from the human body. FIG. 6 is a standing wave ratio chart which was measured when the portable telephone employing the antenna according to the present invention is in contact with the human body. Referring to FIG. 5, the SWR of the 900 MHz cordless telephone is below 1.5 at the operating frequencies of 914.8 MHz and 959.5 MHz. Referring to FIG. 6, the SWR of the 900 MHz cordless telephone is below 1.8 at the operating frequencies of 914.8 MHz and 959.5 MHz. Namely, the SWR measured when the portable telephone is in contact with the human body is similar to the SWR measured when the portable telephone is separated from the human body. Therefore, it can be noted that the SWR characteristic is almost constant even though the portable telephone comes in contact with the human body.

As described above, the portable telephone according to the present invention has an SWR characteristic which is almost constant even in the case when the portable telephone is in contact with the human body. Therefore, it is possible to increase the coverage area of the portable telephone, thus improving communication quality. Further, the antenna can be reduced in length to about 11 cm, thereby allowing it to be employed in small-sized portable telephones.

While the invention has been shown and described with reference to a specific preferred embodiment thereof, it will be understood by those skilled in the art that various changes in form and details may be made therein without departing from the spirit and scope of the invention as defined by the appended claims.

What is claimed is:

1. An antenna circuit for a portable telephone, comprising:
    an RF (Radio Frequency) module having an impedance of about 50Ω;
    an antenna having an impedance of about 450 to 500Ω, for radiating an RF signal output from said RF module into the air and outputting an RF signal captured from the air to said RF module; and
    a matching circuit connected between said RF module and said antenna to match an impedance characteristic of said RF module with an impedance characteristic of said antenna, wherein said matching circuit includes an inductor having an inductance of about 24 mH directly connected between an output of said RF module and said antenna and a capacitor having a capacitance of about 1 pF directly connected between said antenna and a ground, said capacitor being coupled in parallel to only said inductor.

2. The antenna circuit as claimed in claim 1, wherein said antenna is a λ/2 monopole antenna.

3. The antenna circuit as claimed in claim 1, wherein said antenna has a length of about 11 cm.

4. A method for embodying an antenna circuit for a portable telephone including an RF module having a first impedance, an antenna having a second impedance and a matching circuit connected between the RF module and the antenna to match the first impedance with the second impedance, said method comprising the steps of:
    searching a Smith chart for real resistance component values of the antenna and the RF module, and designating the real resistance component value of the antenna as a value of a first position and the real resistance component value of the RF module as a value of a second position;
    calculating a parallel capacitance value and a serial inductance value by moving the first position to the second position using an admittance chart and an impedance chart of the Smith chart, respectively; and
    coupling the inductor having the calculated inductance value between an output of the RF module and the antenna, and coupling the capacitor having the calculated capacitance value directly between the antenna and a ground, the capacitor being coupled in parallel with only the inductor.

5. The method as claimed in claim 4, wherein the first impedance is about 50Ω, and the second impedance is about 450 to 500Ω.

6. The method as claimed in claim 5, wherein the inductor has an inductance of about 24 mH.

7. The method as claimed in claim 5, wherein tie capacitor has a capacitance of about 1 pF.

8. The method as claimed in claim 4, wherein the antenna is a λ/2 monopole antenna having a length of 11 cm.

* * * * *